United States Patent [19]
Fukushima et al.

[11] 4,376,984
[45] Mar. 15, 1983

[54] PROGRAMMABLE READ-ONLY MEMORY DEVICE

[75] Inventors: Toshitaka Fukushima, Yokohama; Kazumi Koyama, Kanagawa; Kouji Ueno, Kawasaki, all of Japan

[73] Assignee: Fujitsu Limited, Kawasaki, Japan

[21] Appl. No.: 137,959

[22] Filed: Apr. 7, 1980

[30] Foreign Application Priority Data

Apr. 13, 1979 [JP] Japan .................................. 54-45135

[51] Int. Cl.³ .............................................. G11C 11/40
[52] U.S. Cl. ..................................... 365/104; 365/174
[58] Field of Search ................ 365/174, 105, 106, 104

[56] References Cited

U.S. PATENT DOCUMENTS 4,064,493 12/1977 Davis ................................... 365/104
4,180,826 12/1979 Shappir ............................... 365/104
4,207,585 6/1980 Rao ..................................... 365/104

Primary Examiner—Terrell W. Fears
Attorney, Agent, or Firm—Staas & Halsey

[57] ABSTRACT

A PROM (programmable read-only memory) device includes both PROM cells and peripheral circuits cooperating therewith with the PROM cells and peripheral circuits formed in and on the same bulk. The bulk is formed free of metal which acts as a life time killer. Further, in each of the PROM cells, a buffer layer made of a silicon semiconductor, is introduced between a metal electrode, acting as a bit line, and the surface of the bulk at the position where the PROM cell is formed. Furthermore, the peripheral circuits are made by using Schottky TTL (transistor transistor logic) circuits.

30 Claims, 20 Drawing Figures

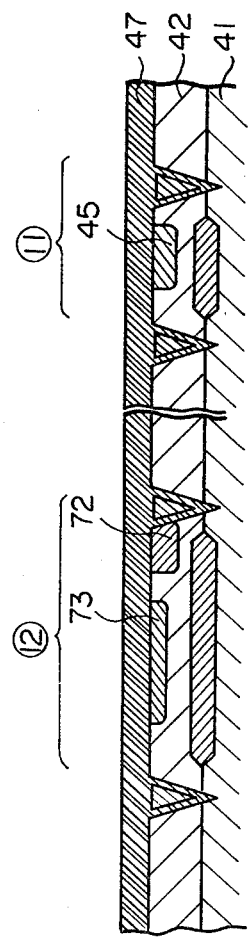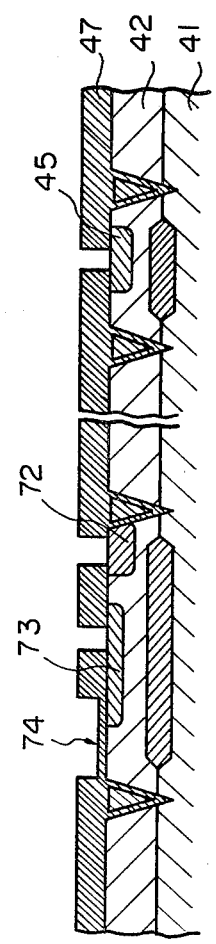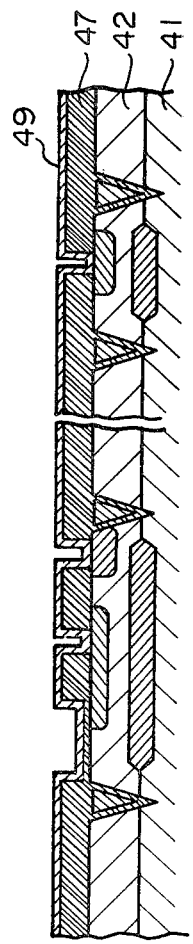
Fig. 7D
Fig. 7E
Fig. 7F

PROGRAMMABLE READ-ONLY MEMORY DEVICE

The present invention relates to a programmable read-only memory device, and more particularly relates to a programmable read-only memory device which is composed of shorted-junction type memory cells and peripheral circuits.

In recent years, a field programmable read-only memory has been widely used in computers and their peripheral equipment. The field programmable read-only memory (hereinafter referred to as PROM) has merit in that the user can electrically write, in the field, data to be stored in the PROM according to his circuit design. Generally, two types of the PROMs are in practical use. The first type is the shorted-junction type PROM, and the second type is the fuse-blown type PROM. In the shorted-junction type PROM, each memory cell comprises two pn junctions, which are connected in series but are different in polarity. When data is stored in the memory cell, one of said pn junctions may be physically broken and electrically shorted. On the other hand, in the fuse-blown type PROM, each memory cell is comprised of a fuse and a pn junction which are connected in series. When data is stored in the memory cell, said fuse may be physically blown.

When compared to the fuse-blown type PROM, the shorted-junction type PROM has the advantage that it is easy to obtain a high density and a highly integrated PROM. This is because, since the shorted-junction type PROM is comprised of two pn junctions in a form of a so-called planar structure bipolar transistor, it is possible to make each memory cell a very small size. Thus, the present invention refers to the PROM device which is comprised of not the fuse-blown type PROM cells, but the shorted-junction type PROM cells.

As will be explained hereinafter, the conventional PROM device contains a so-called life time killer, which is usually a slight admixture of metallic impurities, such as gold or copper. The metal (gold) doping facilitates the recombination of holes and electrons in the bulk of the semiconductor chip. Therefore, in the conventional metal doped PROM device, the transistors in the peripheral circuits, and the memory cells of the same PROM device, can operate at a high speed. In this case, it is the latest tendency to form the PROM device as a very high density and highly integrated PROM device. In order to fabricate the PROM device as a high density and highly integrated PROM device, it is necessary to reduce the thickness of the bulk. This is because, when the thickness of the bulk is small, the p-type regions and n-type regions must be shallow, and accordingly transistors and memory cells which are small in size can be obtained. However, as will be explained later, it is difficult to form shallow p-type regions and n-type regions in the bulk of the PROM device, without losing the electrical function of the PROM device due to the presence of said metal impurities in the bulk.

Therefore, it is an object of the present invention to provide a PROM device, free of metal which acts as a life time killer.

The present invention will be more apparent from the ensuing description with reference to the accompanying drawings wherein:

FIG. 1 schematically illustrates a conventional PROM device;

FIGS. 7A through 7J are sequential cross sectional views of a PROM device according to the present invention, to explain the processes for manufacturing the same.

Figure 1:
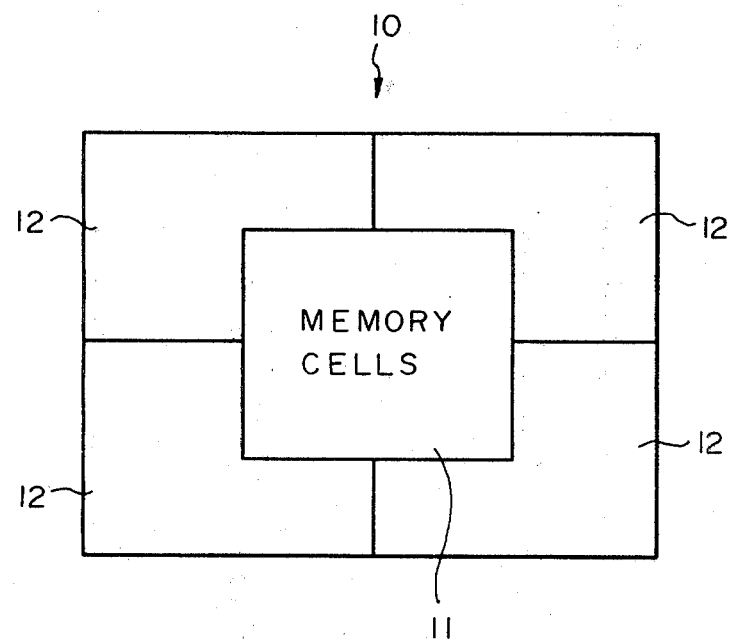

In FIG. 1, which schematically illustrates a conventional PROM device, the PROM device 10 is composed of PROM cells 11 and a plurality of peripheral circuits 12. The PROM cells 11 and the peripheral circuits 12 are formed, as one body, in one semiconductor chip. The data to be stored are written in desired memory cells 11, in the field, by the user. The peripheral circuits include, for example, a circuit for selecting desired memory cells 11, a circuit for writing data in these memory cells 11, a circuit for reading stored data from these memory cells 11, and so on.

Figure 2:
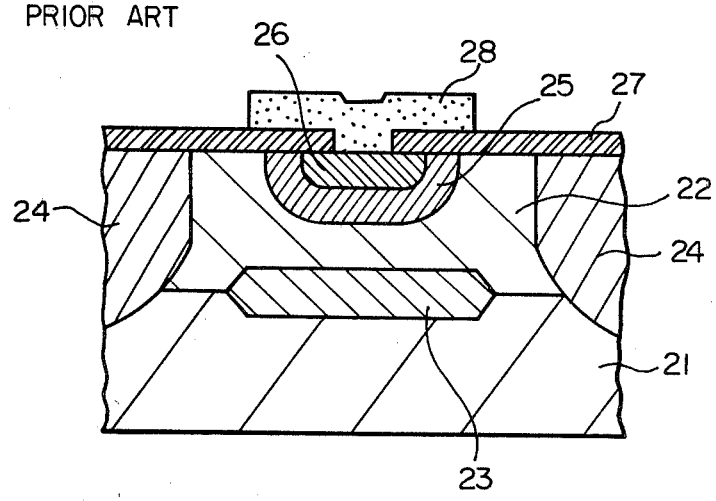
FIG. 2 is a cross sectional view of one of the PROM cells 11 illustrated in FIG. 1.

In FIG. 2, which is a cross sectional view of one of the conventional PROM cells 11 illustrated in FIG. 1, the reference numeral 21 represents a semiconductor substrate, for example a p-type silicon semiconductor substrate. An n-type layer 22 is formed on the substrate 21. The layer 22 may be made by, for example, an epitaxial growth process. Both the substrate 21 and the layer 22 form the so-called bulk. An n+-type buried layer 23 is formed in the bulk. The reference numeral 24 represents an isolation area (isolation region) which acts to isolate the memory cell from adjacent memory cells (not shown) and peripheral circuits (not shown). In the layer 22, a p-type region 25 is formed. In the p-type region 25, a n+-type region 26 is formed. An insulation film 27 is formed on the surface of the bulk. An electrode 28 on the insulation film 27 electrically contacts the n+-type region 26 through a window formed in the film 27.

Thus, the shorted-junction type PROM is obtained. This PROM cell is, as previously mentioned, comprised of two pn junctions. The first one of the two pn junctions corresponds to the pn junction between the p-type region 25 and the n-type layer 22. The second thereof is formed between the p-type region 25 and the n+-type region 26. In this case, the second pn junction (25, 26) may be physically broken and electrically shorted, and accordingly the data to be written is stored in this PROM cell. The shorting of the pn junction (25, 26) is achieved by applying a large write current from the electrode 28, acting as a bit line, to the n+-type buried layer 23 acting as a word line. The large write current induces a rise in temperature along the current path in the bulk. Then a reaction between the electrode 28 and the n+-type region 26 occurs, and a resultant eutectic of the metal electrode 28 and the n+-type silicon region 26 grows in the region 26. The resultant metal-silicon eutectic enters further into the p-type region 25. As a result, said second pn junction (25, 26) is physically broken and electrically shorted by said metal-silicon eutectic. Usually the metal electrode 28 is made of aluminum, because aluminum provides a good reaction with the silicon region 26 so as to produce the metal-silicon eutectic rapidly.

As previously mentioned, a life time killer is contained in the semiconductor chip of the conventional PROM device. The life time killer is useful for increasing the operating speed of the electronic elements, such as diodes, transistors and so on, which comprise the PROM cells and peripheral circuits. In this case, the p-type region 25 and the n-type regions 22 and 26 are liable to be electrically shorted due to the presence of the life time killer which is made of metal impurities, such as gold or copper. Accordingly, in the conventional PROM cells, it is necessary to employ a deep n-type region 26 and a deep p-type region 25, so as to prevent adjacent p-type and n-type regions from being electrically shorted. Also, in the peripheral circuits, it is necessary to employ deep base regions and deep emitter regions in respective transistors, so as to prevent each pair of base and emitter regions from being electrically shorted. For example, in FIG. 2, the thickness of the n-type layer 22 is about 7 $\mu$m, the thickness of the p-type region 25 is about 2 $\mu$m, and the thickness of the n+-type region 26 is about 1 $\mu$m. Consequently, it may be understood that, in the conventional PROM device, it is impossible to employ shallow base regions, shallow emitter regions, shallow p-type regions, and shallow n-type regions, due to the presence of the life time killer.

However, in order to obtain a high density and highly integrated PROM device, it is necessary to fabricate the semiconductor chip of the PROM device with shallow base, emitter, p-type, and n-type regions. It should be noted that when these regions are formed deeply in the bulk through a diffusion process, the diffused regions necessarily extend not only in the longitudinal direction but also in the lateral direction. As a result, each of the diffused regions occupies a large space in the bulk. This is the reason why shallow regions must be employed in the bulk, in order to obtain a high density and highly integrated PROM device.

In the present invention, in order to employ shallow regions in the bulk of the PROM device, the life time killer is eliminated from the conventional PROM device. Since there is no life time killer in the PROM device, the PROM cells 11, the p-type region 25, the n+-type region 26, and the n-type layer 22 are not liable to be easily shorted with each other. Accordingly, shallow regions 22, 25, and 26 can be employed in the bulk, so that high density and highly integrated PROM cells are obtained. However, when these regions are made shallow, the above mentioned metal-silicon eutectic is liable to enter from the boundary between the electrode 28 and the n+-type region 26, into the p-type region 25—due to the heat applied to the bulk during fabrication processes, even though, for the given PROM cell, no data is to be stored or written therein.

On the other hand, in the peripheral circuits of the PROM device, since there is no life time killer in the bulk, the operating speed of the transistors is relatively low. Therefore, the peripheral circuits of the PROM device according to the present invention must be designed so as to maintain the operating speed of the transistors no lower than the operating speed achieved in conventional peripheral circuits.

In short, the PROM device, having no life time killer, according to the present invention, must satisfy the following two conditions:

(1) the metal-silicon eutectic should be suppressed from growing during the fabrication process, and (2) the operating speed of the electronic elements should be maintained at a level as high as the level of the operating speed achieved in the conventional PROM device which includes a life time killer.

Figure 3:
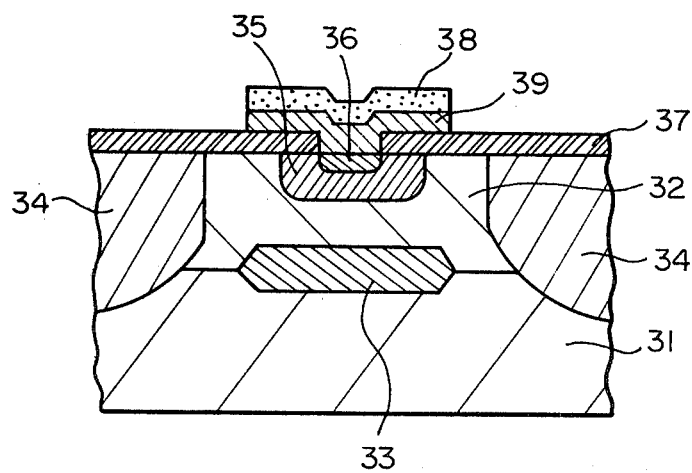
FIG. 3 is a cross sectional view of a PROM cell according to the present invention.

FIG. 3 is a cross sectional view of one of the PROM cells according to the present invention. Members 31 through 38 respectively correspond to members 21 through 28 illustrated in FIG. 2. However, the memory cell of this Figure contains no life time killer, and accordingly a shallow layer 32 and shallow regions 35 and 36 can be realized. Thus, each of the memory cells does not occupy a large space in the bulk, and accordingly high density and highly integrated PROM cells can be obtained. However, since the depth of each of the regions 35 and 36 is shallow, the above mentioned metal-silicon eutectic would very likely enter into the region 35 via the shallow region 36. Accordingly, each memory cell might unnecessarily be broken and shorted by the heat which is applied thereto during the fabrication processes. For the purpose of resolving the above mentioned problem, a buffer layer 39 is inserted between the n+-type region 36 and the metal electrode 38. Such a buffer layer 39 is not found in the PROM cell of FIG. 2. The buffer layer 39 is preferably made of a silicon semiconductor material, such as monocrystalline silicon or polycrystalline silicon. In this case, the above mentioned metal-silicon eutectic is first created in the buffer layer 39 and then enters into the region 36 slowly, but does not further enter into the region 35 as long as the above mentioned write current does not flow through the electrode 38, the buffer layer 39, regions 36 and 35, the layer 32, and the buried layer 33. When the write current is applied, the pn junction between 35 and 36 is physically broken and electrically shorted by the metal-silicon eutectic provided from the buffer layer 39.

Since the PROM cell of FIG. 3 contains no life time killer, parasitic lateral pnp transistors are created between the PROM cell of FIG. 3 and adjacent PROM cells (not shown). Therefore, it is preferable to isolate each PROM cell from the adjacent PROM cells by means of suitable isolation areas. The isolation area will be clear with reference to FIGS. 4A through 4C and FIGS. 7A through 7J.

Regarding the peripheral circuits 12 (see FIG. 1), when the bulk contains no life time killer therein, the operating speed of the actual transistors which comprise the peripheral circuits is considerably reduced. However, in the present invention, though shallow regions and no life time killer are employed in the peripheral circuits, as in the PROM cell of FIG. 3, the above mentioned reduction of the operating speed can be avoided by using transistors with shallow bases and shallow emitters. The reduction of the operating speed can further be avoided by not employing saturation mode transistors as is the usual practice, but employing non-saturation mode transistors instead. The non-saturation mode transistors can be realized by using, for example, Schottky TTL (transistor transistor logic)

circuits. The Schottky TTL circuit will be clarified with reference to FIGS. 7A through 7J.

Figures 4A, 4B, 4C:
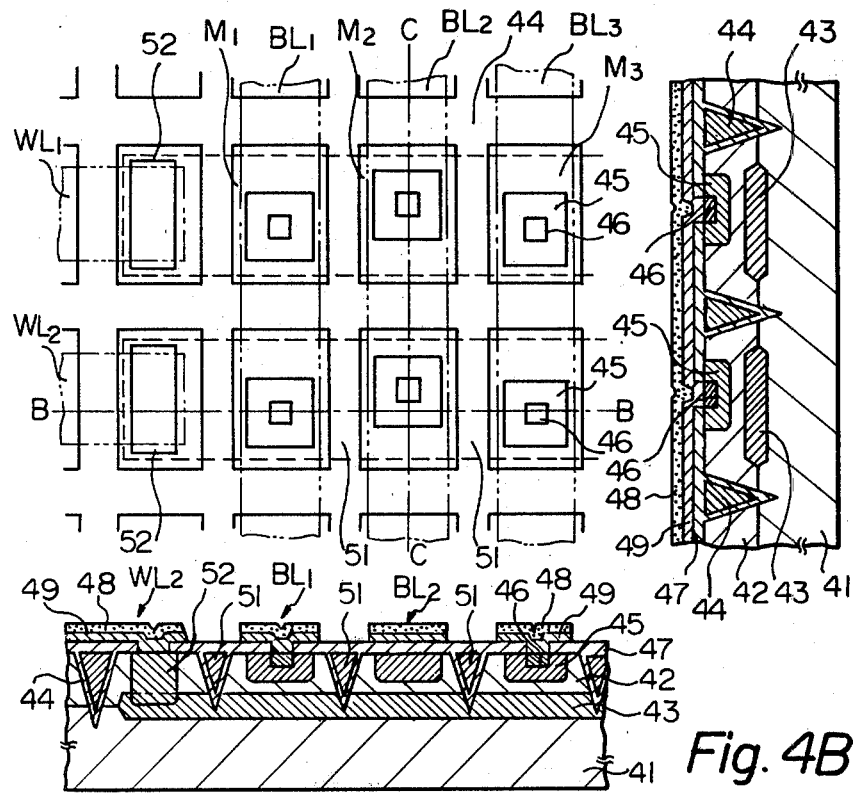
FIG. 4A is a plan view of PROM cells according to the present invention, in order to explain the arrangement of the PROM cells.
FIG. 4B is a cross sectional view taken along line B—B in FIG. 4A.
FIG. 4C is a cross sectional view taken along line C—C in FIG. 4A.

The actual arrangement of the PROM cells will be clarified with reference to FIGS. 4A, 4B, and 4C. FIG. 4A is a plan view of PROM cells to explain the actual arrangement of the PROM cells according to the present invention. FIGS. 4B and 4C are sectional views taken along lines B—B and C—C, shown in FIG. 4A, respectively. Referring to FIGS. 4A, 4B, and 4C, the PROM cells are located at respective cross points defined by word lines ($WL_1$, $WL_2$ ---) and bit lines ($BL_1$, $BL_2$ ---). The word and bit lines are arranged in a grid-like fashion. Members 41 through 49 of FIGS. 4A, 4B, and 4C are identical to the members 31 through 39 of FIG. 3, respectively. As previously mentioned, since a life time killer is not contained in the bulk, parasitic lateral pnp transistors are created between each adjacent PROM cell ($M_1$, $M_2$, $M_3$ ---). Accordingly, the above mentioned suitable isolation areas must be inserted therebetween. The isolation areas (isolation regions) are represented by the reference numerals 44 and 51. The isolation areas 44 and 51 are formed by the following steps. Firstly, V shaped grooves are formed in the n-type layer 42; secondly, the surfaces of the V shaped grooves are covered by insulation layers, such as $SiO_2$, and lastly, polycrystalline semiconductor materials fill the V shaped grooves having the insulation layers thereon. The isolation areas formed by the V shaped grooves require much smaller spaces in the bulk than the isolation areas formed by conventional pn junctions. Each of the isolation areas 44 extends from the surface of the n-type layer 42 to the substrate 41. Thus, the isolation areas 44 isolate the PROM cells which are arranged along word lines from each other. Each of the isolation areas 51 extends from the surface of the n-type layer 42 to the $n^+$-type buried layer 43. This layer 43 is not cut off by the isolation areas 51, because the layer 43 acts as a part of the word line $WL_2$. Thus, the isolation areas 51 isolate the PROM cells, which are arranged along bit lines, from each other. The depth of each of the V shaped grooves can easily be controlled by suitably determining the size of respective mouth portions of the grooves exposed on the surface of the bulk. Each of the $n^+$-type buried layers 43, located between two adjacent isolation areas 44, acts as a layer having low resistance value to be connected to respective word lines at the surface of the n-type layer 42 via a conductive region 52. Thus, each of the PROM cells ($M_1$, $M_2$, $M_3$ ---) which are composed of the p-type region 46 and n-type region 45, is isolated from neighboring PROM cells by the two adjacent isolation areas 44 and the two adjacent isolation areas 51, respectively, along bit lines and word lines. Each of the bit lines $BL_1$, $BL_2$, $BL_3$ --- is connected with a corresponding one of the PROM cells located in each of the word lines $WL_1$, $WL_2$, $WL_3$ ---.

The above mentioned parasitic lateral pnp transistors can also be diminished by arranging the PROM cells with a zig-zag pattern as illustrated in FIG. 4A. The zig-zag pattern arrangement is useful for suppressing electrical parasitic interconnection between each two adjacent PROM cells in the bulk which contains the life time killer.

If the data to be stored are written in, for example, the PROM cell $M_1$, a positive write voltage is applied to the bit line $BL_1$ and a negative write voltage is applied to the word line $WL_1$. Then, the pn junction between the regions 46 and 45 is inversely biased by said positive and negative write voltages, and the pn junction (46 and 45) is heated by the large write current. Thus, the pn junction (46 and 45) of the PROM cell $M_1$ is physically broken and electrically shorted by said metal-silicon eutectic which extends from the buffer layer 49 to the p-type region 45.

Figure 5A:
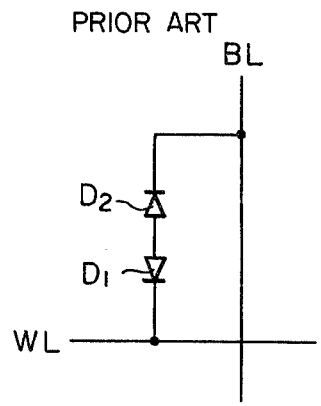
FIG. 5A is an equivalent circuit diagram of a conventional PROM cell before programming.
Figure 5B:
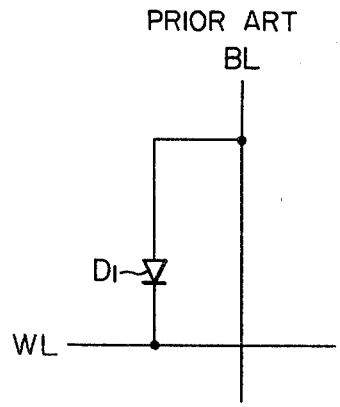
FIG. 5B is an equivalent circuit diagram of a conventional PROM cell after programming.

The conventional PROM cell has an equivalent circuit diagram, as shown in FIG. 5A, composed of two pn junctions, that is a first diode $D_1$ and a second diode $D_2$. The diodes $D_1$ and $D_2$ are connected in series (but have different polarities) between the word line WL and the bit line BL (see FIG. 5A). The diode $D_1$ corresponds to the pn junction between the regions 42 and 45, and the diode $D_2$ corresponds to the pn junction between the regions 45 and 46. The diode $D_1$ operates so as to block the reverse current flowing from the word line WL to the bit line BL. If the PROM cell is required to store data, the second diode $D_2$ is physically broken and electrically shorted, as illustrated in FIG. 5B, by said metal-silicon eutectic. The write current flowing from the bit line BL to the word line is usually about 200 mA. Therefore, a conventional decoder (not shown) must have enough capacity for receiving such a large write current via the word line. The decoder is accommodated in the peripheral circuit 12 (FIG. 1). However, in the present invention, it is not necessary for the decoder to receive such a large write current of 200 mA. This is because, since the regions 45 and 46 and the n-type layer 42 are shallow, each PROM cell is very small. It should be understood that the small PROM cell cannot accommodate a large write current flowing therethrough, and the write current can be reduced to about 120 mA.

Figure 6A:
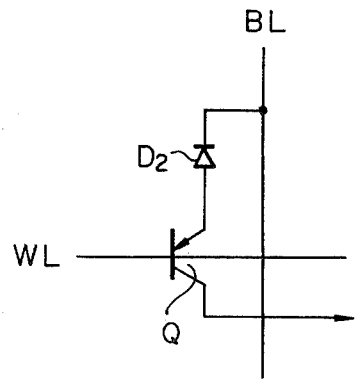
FIG. 6A is an equivalent circuit diagram of a PROM cell according to the present invention, before programming.
Figure 6B:
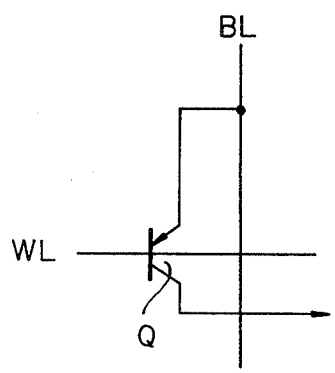
FIG. 6B is an equivalent circuit diagram of a PROM cell according to the present invention after programming.
Figure 7A:
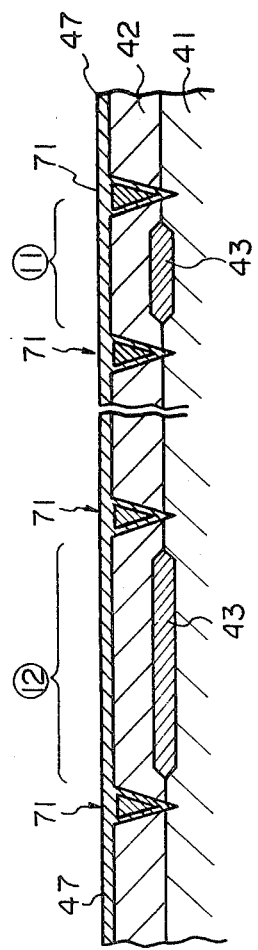
Figure 7B:
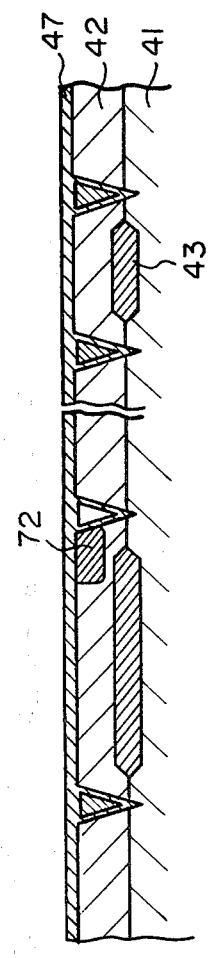
Figure 7C:
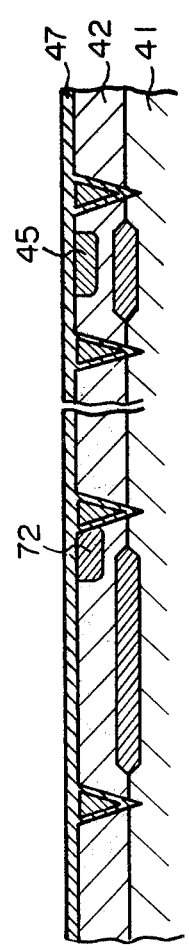
Figure 7G:
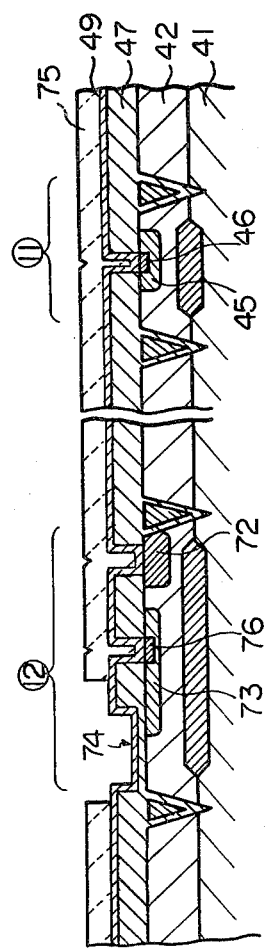
Figure 7H:
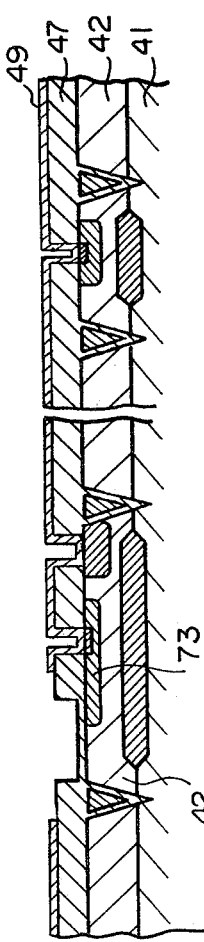
Figure 7I:
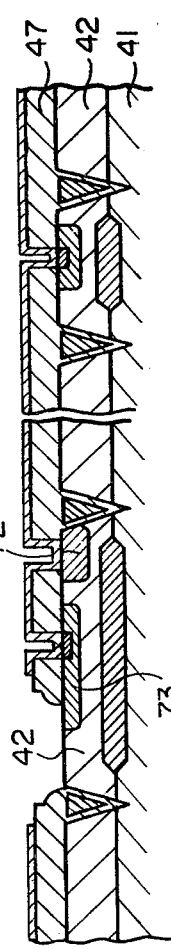
Figure 7J:
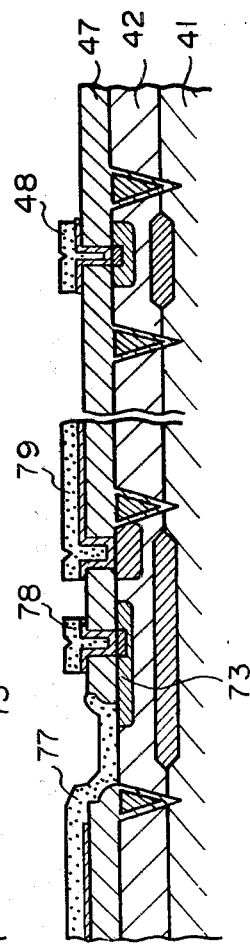

Futher, the shallower the regions 45 and 46 and the n-type layer 42 are, the more the current to be received by said decoder can be reduced. The reason for this will be clarified with reference to FIGS. 6A and 6B. FIG. 6A is an equivalent circuit diagram of a PROM cell before programming, having very shallow regions 45 and 46 and an n-type layer 42 in accordance with the present invention. FIG. 6B is an equivalent circuit diagram of this PROM cell after programming. Referring to FIGS. 6A and 6B, the reference symbol Q represents a vertical pnp transistor. The construction of this transistor Q may be clarified with reference to FIG. 4C. In FIG. 4C, since the n-type layer 42 is very shallow, the write current flows from the bit line (48) to the decoder, not only through the $n^+$-type buried layer 43 but also through the substrate 41. Accordingly, the p-type region 45 forms the emitter of the transistor Q (FIGS. 6A and 6B), the n-type layer 42 forms the base thereof and the p-type substrate 41 forms the collector thereof. The base of the transistor Q is also electrically connected to the $n^+$-type buried layer 43 acting as a part of the word line WL. Returning to FIGS. 6A and 6B, the greatest part of the write current of about 120 mA flows through the emitter and collector of the transistor Q. Accordingly, a very small write current (equal to $I_W/\beta$) is supplied to the decoder via the word line WL, where the symbol $I_W$ denotes the amplitude of the write current and the symbol $\beta$ denotes the current amplification factor of the transistor Q. The current amplification factor $\beta$ is about 30. Therefore, the decoder receives a very small write current of about 4 (120/30) mA. Thus, the decoder can be fabricated with very small size diodes, transistors, and other electronic elements.

FIGS. 7A through 7J are cross sectional views to explain the sequential processes for fabricating a PROM device according to the present invention. In each of these Figures, the right portion designated by the symbol ⑪ corresponds to the PROM cells area (see the area 11 in FIG. 1), and the left hand portion designated by the sumbol ⑫ corresponds to the peripheral circuits area (see the areas 12 in FIG. 1). In the first process (FIG. 7A), the n-type layer 42 and the n+-type buried layer 43 are formed on the p-type silicon semiconductor substrate 41. Also, isolation areas (isolation regions) 71 (corresponding to the member 44 or 51 in FIGS. 4A, 4B, and 4C) are formed. The surface of the bulk is covered by the insulation film 47 made of silicon dioxide (SiO$_2$). The thickness of the layer 42 is about 3 μm, and the thickness of the insulation film 47 is about 1500 Å.

In the second process (FIG. 7B), an n+-type region 72 is formed. The region 72 acts as a collector contact region of the transistor that will be created in the following processes, which is a part of the peripheral circuit. The region 72 may be made by an ion injection of phosphide or arsenic through a suitable mask (made of, for example, a photoresist) followed by a heating process in an atmosphere filled with nitrogen gas.

In the third process (FIG. 7C), the p-type region 45 is formed, which with the n-type layer 42, creates the first pn junction of the PROM cell. The region 45 may be made by an ion injection of boron (B) through a suitable mask made of, for example, a photoresist, followed by a heating process in an atmosphere filled with nitrogen gas.

In the fourth process (FIG. 7D), a p-type region 73 is formed. The region 73 acts as a base of the transistor, which will be completed in the following process. The region 73 may also be made by an ion injection of boron through a suitable mask made of, for example, a photoresist, followed by a heating process in an atmosphere filled with nitrogen gas. It should be noted that the insulation film 47 made of SiO$_2$ is also augmented during said heating process. Thus, the insulation film 47 becomes 3000~4000 Å in thickness. In this case, the thickness of the p-type region 45 becomes about 1.2 μm, and the thickness of the p-type region 73 becomes about 1.0 μm. Since the process for making the region 73 begins after the process for making the region 45, the region 73 is shallower than the region 45. It is preferable to further increase the thickness of the insulation film 47, through a chemical vapor deposition (CVD) process, so that the capacitance value of the parasitic capacitor developed in the film 47, may be reduced. The capacitance value obtained by the electrode located on the film 47 and the bulk lying beneath the film 47 should always be small in order to obtain high operating speed.

In the fifth process (FIG. 7E), windows are formed in the insulation film 47 directly above the regions 45, 72, and 73. In this case, a recess 74 is also formed in the film 47, by using a selective etching such as photo etching or plasma etching.

In the sixth process (FIG. 7F), a buffer layer 49 is grown on the entire surface of the semiconductor chip. The buffer layer 49 is 1 μm thick, and is made of polycrystalline silicon and also monocrystalline silicon. The polycrystalline silicon is grown on the film 47 made of SiO$_2$ and the monocrystalline silicon grows on the n-type layer 42, during a heating decomposition process using monosilane (SiH$_4$). The buffer layer 49 is one of the important features of the present invention (refer to the layer 39 in FIG. 3).

In the seventh process (FIG. 7G), a phosphosilicate glass (PSG) layer 75 is applied over the surface of the semiconductor chip, except for the area located at and around the recess 74. The phosphorus contained in the PSG layer 75 enters into the n-type layer 42, via the buffer layer 49, so that the n+-type region 46 and a n+-type region 76 are formed, respectively in the p-type region 45 and the p-type region 73. The n+-type region 46 and the p-type region 45 provide the second pn junction of the PROM cell. The n+-type region 76 acts as an emitter of said transistor. Thus, one of the transistors in the peripheral circuit is made. In this seventh process, it is important to note that said buffer layer 49 also produces another advantage. If no such buffer layer 49 existed, the phosphorus of the PSG layer 75 would enter smoothly and deeply into the p-type regions 45 and 73. Therefore, it would be impossible to obtain shallow p-type regions 45 and 73. However, in the seventh process, it is easy to obtain shallow p-type regions 45 and 73, because the buffer layer 49 prevents the phosphorus from entering into these regions smoothly and deeply. Thus, shallow regions are formed in the bulk.

The PSG layer 75 may be applied through a vapor phase reaction process using monosilane (SiH$_4$), phosphine (PH$_4$), and oxygen (O$_2$). The recess 74 of the PSG layer 75 may be formed by a photo etching.

In the eighth and ninth processes (FIGS. 7H and 7I), and PSG layer 75 is entirely removed from the semiconductor chip, and then the buffer layer 49 and the insulation layer 47 are selectively removed therefrom, so as to form a window in the insulation layer 47 and to expose the layer 42 and the p-type layer 73. The buffer layer 49 and the p-type layer may be removed selectively through a plasma etching process. As previously mentioned, since the bulk contains no life time killer, the operating speed of each transistor in the peripheral circuit ⑫ is reduced. However, in the PROM device the present invention, the reduction of the operating speed is avoided, by introducing the aforesaid Schottky TTL circuit. Therefore, the pn junction between the n-type layer 42 and the p-type layer 73 is exposed on the surface of the bulk so as to directly contact a metal. The metal is coated onto the exposed area, and acts as a base electrode 77 of the transistor comprising a part of the Schottky TTL circuit. Thus, the base electrode 77 forms, on one hand, ohmic contact with the base region (73), and, on the other hand, a Schottky barrier contact with the collector region (42). A metal electrode 78 acts as an emitter electrode, and a metal electrode 79 acts as a collector electrode. The metal electrode 48 acts as the bit line (BL) of the PROM cell. These metal electrodes are made of aluminum, titanium-aluminium alloy, or titanium-tungsten-aluminum alloy.

As explained above in detail, the PROM device of the present invention is free of metal which acts as the life time killer. Accordingly, shallow regions can be formed in the bulk, and a high density and highly integrated PROM device can be realized.

We claim:
1. A PROM device, comprising: a semiconductor bulk, both PROM cells and peripheral circuits cooperating therewith formed in and on the same semiconductor bulk, and wherein each of the PROM cells comprise:
a first pn junction and a second pn junction in series, both formed in said bulk;
a metal electrode for use as a bit line, formed on the surface of the bulk adjacent to the second pn junction, the second pn junction being broken or not broken in accordance with data to be stored, said bulk being formed free of metal which acts as a life time killer; and a buffer layer, made of semiconductor material and formed between said metal electrode and the surface of said bulk, for preventing a metal-semiconductor eutectic from smoothly and deeply entering into the bulk toward said second pn junction, which metal-semiconductor eutectic grows, in the usual manner, between said metal electrode and said buffer layer during a heating process.

2. A device as set forth in claim 1, wherein said semiconductor bulk comprises a silicon substrate and an epitaxial layer formed thereon.

3. A device as set forth in claim 1, wherein said peripheral circuits are fabricated as Schottky TTL (transistor transistor logic) circuits.

4. A device as set forth in claim 1, wherein said buffer layer comprises polycrystalline silicon.

5. A device as set forth in claim 4, wherein said buffer layer further comprises monocrystalline silicon.

6. A device as set forth in claim 1, further comprising isolation areas formed in said bulk, said isolation areas isolating each PROM cell from neighboring PROM cells.

7. A device as set forth in claim 6, wherein each of said isolation areas is made in the form a V shaped groove.

8. A device as set forth in claim 1, wherein said second pn junction is formed by injecting impurities into the bulk through the buffer layer.

9. A device as set forth in claim 1 further comprising a parasitic vertical pnp transistor formed in the bulk beneath the PROM cell, the base of said transistor being connected to a word line (WL).

10. A PROM cell of the type having first and second junctions opposed in series, information being permanently stored in said PROM cell by selectively short circuiting said first junction, said PROM cell comprising:

a substrate, comprising a semiconductor material of a first conductivity type;

a epitaxial layer atop said substrate, comprising a semiconductor material of a second conductivity type;

a first region in said epitaxial layer and spaced from said substrate, said first region comprising a semiconductor material of said first conductivity type and forming a first pn junction with said second conductivity type semiconductor material of said epitaxial layer;

a second region in and spaced from said first pn junction, said second region comprising a semiconductor material of said second conductivity type and forming a second pn junction with said first conductivity type semiconductor material of said first region;

a buffer layer atop said second region; and a metallic contact atop said buffer layer;

said buffer layer preventing a metal-type semiconductor eutectic, formed of the metallic material of said metallic contact and the semiconductor material of said second region and which grows in the absence of said buffer layer during normal heating processes, from entering deeply into said epitaxial layer and towards said second pn junction.

11. The device of claim 10, wherein said substrate and said epitaxial layer do not include gold or copper doping.

12. The device of claim 11, wherein said substrate and said epitaxial layer are free of metal which acts as a lifetime killer.

13. The device of claim 10, wherein said first conductivity type comprises type P, and said second conductivity type comprises type N.

14. The device of claim 10, wherein said first conductivity type comprises type N, and said second conductivity type comprises type P.

15. The device of claim 10, further comprising:

a buried layer of said second conductivity type, positioned atop said substrate and beneath said epitaxial layer.

16. The device of claim 10, wherein said buffer layer comprises polysilicon.

17. The device of claim 10, wherein said metallic contact comprises aluminum.

18. The device of claim 10, wherein said metallic contact comprises an alloy of titanium and aluminum.

19. The device of claim 10, wherein said metallic contact comprises an alloy of titanium, tungsten, and aluminum.

20. The device of claim 10, wherein said epitaxial layer comprises a thickness significantly less than seven microns.

21. The device of claim 20, wherein said first region comprises a thickness significantly less than 2 microns.

22. The device of claim 21, wherein said second region comprises a thickness significantly less than 1 micron.

23. A PROM using PROM cells of the type having first and second junctions opposed in series, information being permanently stored in each said PROM cell by selectively short circuiting said first junction, each said PROM cell comprising:

a substrate, comprising a semiconductor material of a first conductivity type;

an epitaxial layer atop said said substrate, comprising a semiconductor material of a second conductivity type;

a first region in said epitaxial layer and spaced from said substrate, said first region comprising a semiconductor material of a second conductivity type and forming a first pn junction;

a second region in said first region and spaced from said first pn junction, said second region comprising a semiconductor material of said second conductivity type and forming a second pn junction;

a buffer layer, atop said second region; and a metallic contact atop said buffer layer;

said buffer layer preventing a metal-type semiconductor eutectic, formed of the metallic material of said metallic contact and the semiconductor material of said second region and which grows in the absence of said buffer layer during normal heating processes, from entering deeply into said epitaxial layer and towards said second pn junction said PROM device further comprising:

a word line, comprising a semiconductor material having relatively high conductivity and being of said second conductivity type, said word line being adjacent to and in contact with said epitaxial layer.

24. A PROM using PROM cells of the type having first and second junctions opposed in series, information being permanently stored in each said PROM cell by selectively short circuiting said first junction, each said PROM cell comprising:

a substrate, comprising a semiconductor material of a first conductivity type;

an epitaxial layer in said said substrate, comprising a semiconductor material of a second conductivity type;

a first region in said epitaxial layer and spaced from said substrate, said first region comprising a semiconductor material of a second conductivity type and forming a first pn junction;

a second region in said first region and spaced from said first pn junction, said second region comprising a semiconductor material of said second conductivity type and forming a second pn junction;

a buffer layer atop said second region; and a metallic contact atop said buffer layer; said buffer layer preventing a metal-type semiconductor eutectic of the metallic material of said metallic contact and the semiconductor material of said second region which grows in the absence of said buffer layer during normal heating processes, from entering deeply into said epitaxial layer and towards said second pn junction;

said PROM device further comprising:

a word line comprising a semiconductor material having relatively high conductivity and being of said second conductivity type, said word line being adjacent to and in contact with said epitaxial layer;

first isolation regions, parallel to said word line, extending vertically upward from said substrate; and second isolation regions, perpendicular to said word line, extending vertically upward from said word line and from said substrate without breaking and continuity of said word line.

25. The device of claim 23 or 24, wherein said first and said second isolation regions each comprise:

a V-groove formed in said epitaxial layer;

a silicon dioxide layer lining the sides of said V-groove; and polysilicon, filling the centers of said V-grooves.

26. The device of claim 23 or 24, further comprising:

decoding means operatively connected to said word line for selectively providing a current to said word line and to the PROM cell.

27. The device of claim 23 or 24, further comprising:

decoding means operatively connected to said word line for selectively providing a current to said word line and to the PROM cell, said decoding means supplying said current in the amount of approximately 4 mA.

28. The device of claim 23 or 24, further comprising:

decoding means operatively connected to said word line for selectively providing a current to said word line and to the PROM cell, said decoding means comprising a Schottky clamped transistor.

29. The device of claims 10, 23 or 24, further comprising:

means for providing a write current to said metallic contact of the PROM cell;

said write current comprising approximately 120 mA.

30. The device of claims 10, 23 or 24, wherein said PROM cells are arranged in a zig-zag pattern.

* * * * *

UNITED STATES PATENT AND TRADEMARK OFFICE
CERTIFICATE OF CORRECTION

PATENT NO. : 4,376,984
DATED : March 15, 1983
INVENTOR(S) : Fukushima et al.

It is certified that error appears in the above-identified patent and that said Letters Patent is hereby corrected as shown below:

```
Column  1, line 42, delete "the";
Column  2, line 20, after "invention" insert --,--;
           line 50, "a" should be --an--.
Column  5, line 13, "fashion" should be --pattern--.
Column  7, line 24, after "which" insert --,--.
Column  8, line 27, "and" should be --the--;
           line 32, "p-type" should be --insulation--;
           line 32, after "layer" insert --47--;
           line 36, after "device" insert --of--;
 Column 10, line 41, delete "said" (second occurrence).
 Column 11, line  5, delete "said" (second occurrence).
```

Signed and Sealed this

Twenty-ninth Day of November 1983

[SEAL]

Attest:

GERALD J. MOSSINGHOFF

Attesting Officer

Commissioner of Patents and Trademarks